United States Patent [19]

Kawai et al.

[11] Patent Number: 5,675,173
[45] Date of Patent: Oct. 7, 1997

[54] SEMICONDUCTOR DEVICE HAVING A TRENCH FOR ISOLATING ELEMENTS AND A TRENCH FOR APPLYING A POTENTIAL TO A SUBSTRATE

[75] Inventors: Hirofumi Kawai, Yokohama; Hiroyuki Miyakawa, Kawasaki; Koji Kimura, Chigasaki, all of Japan

[73] Assignee: Kabushiki Kaisha Toshiba, Kawasaki, Japan

[21] Appl. No.: 588,322

[22] Filed: Jan. 18, 1996

[30] Foreign Application Priority Data

Jan. 19, 1995 [JP] Japan ................................. 7-006340

[51] Int. Cl.⁶ ................................................ H01L 29/06
[52] U.S. Cl. ........................ 257/508; 257/510; 257/520; 257/622
[58] Field of Search ............................ 257/514, 518, 257/519, 520, 576, 755, 374, 508–513, 515–517, 521, 622

[56] References Cited

U.S. PATENT DOCUMENTS

| | | | |
|---|---|---|---|
| 4,924,284 | 5/1990 | Beyer et al. | 257/508 |
| 5,045,904 | 9/1991 | Kobayashi et al. | 257/513 |
| 5,065,216 | 11/1991 | Suzuki et al. | 257/517 |
| 5,473,186 | 12/1995 | Morita | 257/519 |

FOREIGN PATENT DOCUMENTS

| | | | |
|---|---|---|---|
| 0 376 723 | 7/1990 | European Pat. Off. | |
| 0148760 | 6/1990 | Japan | 257/508 |

*Primary Examiner*—Tom Thomas
*Assistant Examiner*—David B. Hardy
*Attorney, Agent, or Firm*—Finnegan, Henderson, Farabow, Garrett & Dunner, L.L.P.

[57] ABSTRACT

The opening width of an element isolating trench is Wa'. The opening width of a substrate potential setting trench is Wb'. When the maximum film thickness of a polysilicon film lying on the side wall of each of the trenches is set to t, the opening width Wa' of the element isolating trench and the opening width Wb' of the substrate potential setting trench satisfies a condition that (Wa'−2t)<(Wb'−2t) and Wa'>2t. A silicon oxide film covers the entire portion of the internal surface of the element isolating trench and covers the internal surface of the substrate potential setting trench except the bottom portion thereof. Therefore, the polysilicon film in the element isolating trench is set in the electrically floating state and the polysilicon film in the substrate potential setting trench is connected to the semiconductor substrate.

6 Claims, 9 Drawing Sheets

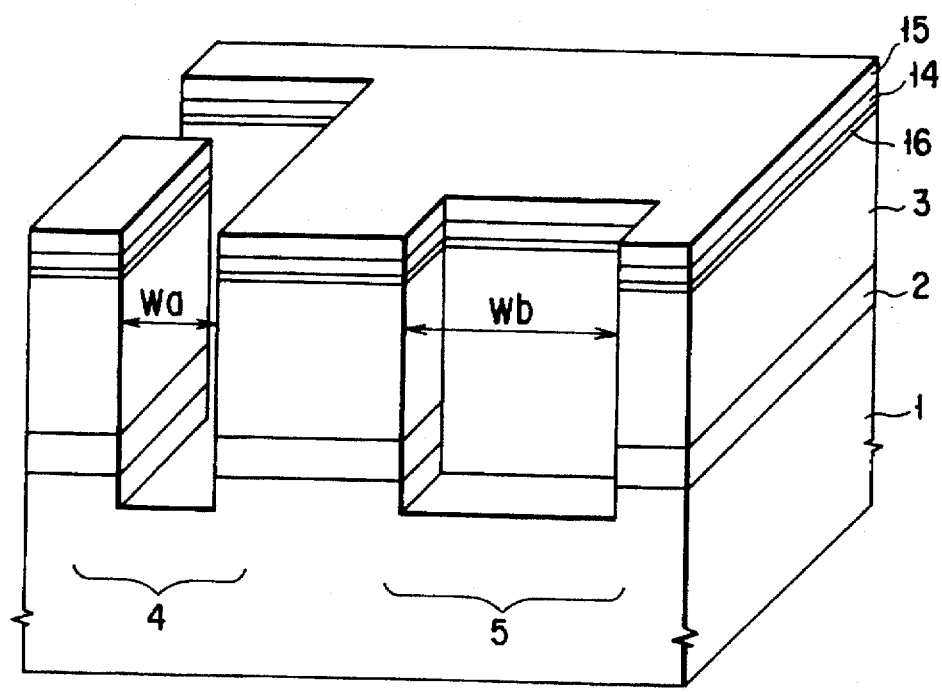
F I G. 10
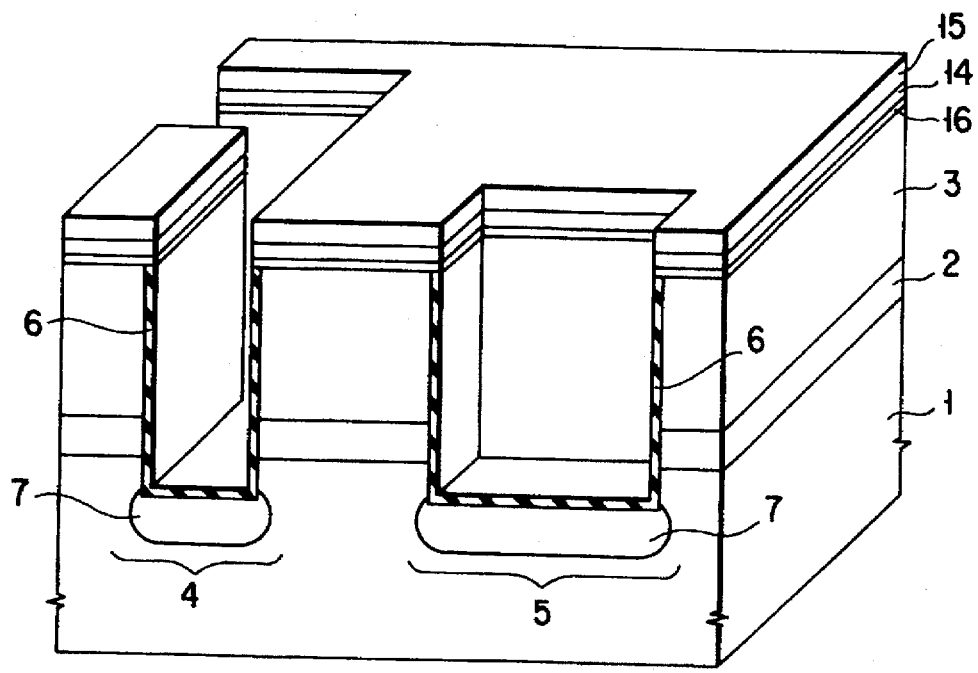
F I G. 11

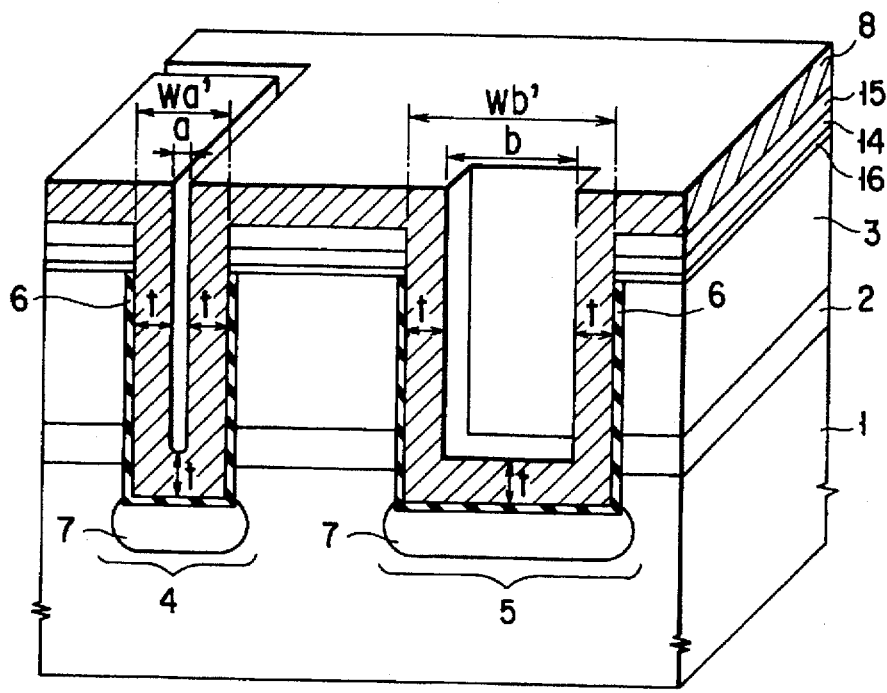
F I G. 12
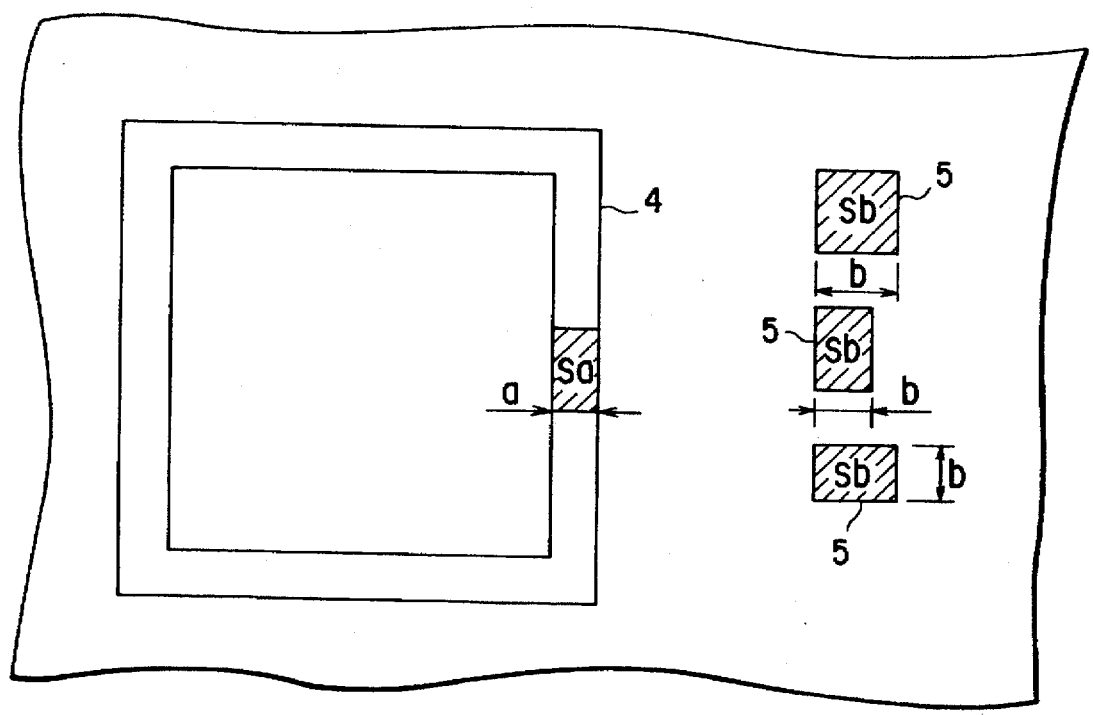
F I G. 13

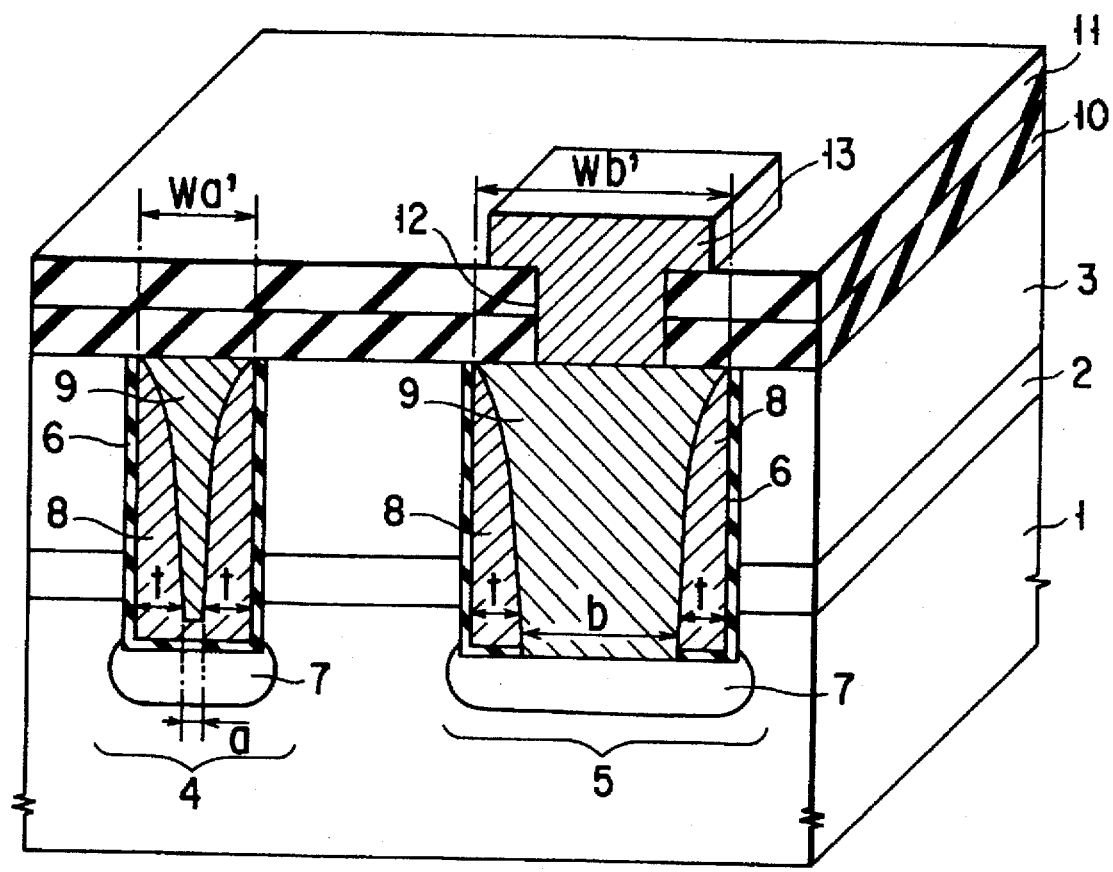
F I G. 16

SEMICONDUCTOR DEVICE HAVING A TRENCH FOR ISOLATING ELEMENTS AND A TRENCH FOR APPLYING A POTENTIAL TO A SUBSTRATE

BACKGROUND OF THE INVENTION

1. Field of the Invention

This invention relates to an element isolation structure for electrically isolating a plurality of semiconductor elements from one another.

2. Description of the Related Art

FIGS. 1 and 2 show a conventional semiconductor device. FIG. 1 is a plan view of the conventional semiconductor device and FIG. 2 is a cross sectional view taken along the line II—II of FIG. 1.

An N-type impurity layer 2 is formed on a P-type silicon substrate 1. An N-type epitaxial layer 3 is formed on the N-type impurity layer 2.

An element isolating trench 4 is formed to extend from the surface of the N-type epitaxial layer 3 to the substrate 1. Trenches 5 for applying a potential to the substrate 1 are formed to extend from the surface of the N-type epitaxial layer 3 to the substrate 1.

The trench 4 is formed in a ring form to surround an element region in the central portion of the substrate 1, and the trenches 5 are formed in a well form in the peripheral portion of the substrate 1. Silicon oxide films 6 are formed on the side surfaces and bottom surfaces of the trenches 4, 5. In this case, portions of the silicon oxide films 6 which lie on parts of the bottom surfaces of the trenches 4, 5 are removed.

P-type impurity layers 7 of high impurity concentration are formed in the substrate 1 in the bottom portions of the trenches 4, 5. Polysilicon films 8 are formed on the side surfaces of the trenches 4, 5. Further, the trenches 4, 5 are filled with polysilicon films 9.

A laminated structure of a field oxide film 10 and inter-level insulation film 11 is formed on the N-type epitaxial layer 3 and trenches 4, 5. A contact hole 12 is formed in part of the laminated structure of field oxide film 10 and inter-level insulation film 11 which lies on the trench 5.

A metal wiring 13 is formed in and on the contact hole 12 to reach the polysilicon film 9. Therefore, when a potential is applied to the metal wiring 13, the potential is applied to the substrate 1 via the polysilicon film 9 in the trench 5 and the P-type impurity layer 7.

A method for manufacturing the semiconductor device shown in FIGS. 1 and 2 is explained below.

As shown in FIG. 3, an N-type impurity layer 2 is formed on a P-type silicon substrate 1. Further, an N-type epitaxial layer 3 is formed on the N-type impurity layer 2 by the epitaxial growth.

Next, a silicon nitride film 14 and silicon oxide films 15, 16 are formed on the epitaxial layer 3. Further, the silicon nitride film 14 and silicon oxide films 15, 16 are patterned by the photo etching process.

After this, the N-type epitaxial layer 3 is etched by the anisotropic etching process with the silicon oxide film 15 used as a mask to form an element isolating trench 4 extending from the surface of the N-type epitaxial layer 3 to the substrate 1 and trenches 5 which are used for applying a potential to the substrate 1 and formed to extend from the surface of the N-type epitaxial layer 3 to the substrate 1.

The trench 4 is formed to surround the element region in the central portion of the substrate 1 and the trenches 5 are formed in a well form in the peripheral portion of the substrate 1.

Next, as shown in FIG. 4, defective layers of the internal surfaces of the trenches 4, 5 are removed by use of the isotropic etching method, chemical processing such as SH processing.

Then, silicon oxide films 6 are formed on the internal surfaces of the trenches 4, 5 by the thermal oxidation method.

P-type impurity layers 7 of high impurity concentration are formed in the bottom portions of the trenches 4, 5 by ion-implanting P-type impurity such as boron into the substrate 1 in the bottom portions of the trenches 4, 5 by the ion-implantation technique with the silicon nitride film 14 and silicon oxide films 15, 16 used as a mask.

Next, as shown in FIG. 5, a polysilicon film 8 is formed on the entire surface of the substrate 1 by the CVD method.

Further, as shown in FIG. 6, the polysilicon film 8 is etched by the anisotropic etching process and only those portions of the polysilicon film 8 which lie on the side surfaces of the trenches 4, 5 are left behind. After this, the etching process using $NH_4F$, for example, is effected to remove the silicon oxide films 6 on the bottom portions of the trenches 4, 5 so as to expose the P-type impurity layers 7.

Next, as shown in FIG. 7, a polysilicon film 9 is formed on the entire surface of the substrate 1 by the CVD method. Then, P-type impurity such as boron is injected into the polysilicon film 9 by, for example, the ion-implantation technique to lower the resistance of the polysilicon film 9.

Further, the polysilicon film 9 is partly removed by the polishing process or the like so as to be left behind only in the trenches 4, 5, and at the same time, the silicon oxide film 15 (refer to FIG. 6) is removed by using $NH_4F$. Then, the silicon nitride film 14 and silicon oxide film 16 (refer to FIG. 6) are patterned and the silicon nitride film 14 and silicon oxide film 16 are left behind only on the element region.

After this, when a field oxide film 10 is formed by the LOCOS method, for example, the element isolation process is completed.

Further, the silicon nitride film 14 and silicon oxide film 16 on the element region are removed, and MOS transistors or bipolar transistors are formed in the element region.

After this, an inter-level insulation film 11 is formed on the entire surface of the substrate 1. Then, a contact hole 12 is formed in the field oxide film 10 and inter-level insulation film 11 on the trench 5.

By forming a metal wiring 13 in and on the contact hole 12, an electrode for applying a potential to the substrate 1 is completed.

In the conventional semiconductor device and the method for manufacturing the same, the structure of the element isolating trench 4 is exactly the same as the structure of the trench 5 for applying the potential to the substrate 1. That is, also in the element isolating trench 4, the substrate 1 and the polysilicon films 8, 9 in the trench 4 are electrically connected to each other.

Therefore, in a case where a bipolar transistor is formed in the element region, the parasitic capacitance between the collector of the bipolar transistor and the substrate 1 increases due to the capacitance of a capacitor formed of the polysilicon films 8, 9 in the trench 4, the silicon oxide film 6 on the side surface of the trench 4 and the epitaxial layer (collector) 3, thereby lowering the operation speed.

SUMMARY OF THE INVENTION

This invention has been made in order to solve the above problem, and an object of this invention is to provide a semiconductor device having an element isolating structure giving no bad influence on the semiconductor element and a method for manufacturing the same.

In order to attain the above object, a semiconductor device of this invention comprises a semiconductor substrate; a first trench formed in the semiconductor substrate, for isolating semiconductor elements; a second trench formed in the semiconductor substrate, for applying a potential to the semiconductor substrate; a first insulative film formed to cover the entire portion of the internal surface of the first trench; a second insulative film formed to cover the internal surface of the second trench except part of the bottom surface thereof; a first conductive film filled in the first trench; a second conductive film filled in the second trench and connected to the semiconductor substrate; a third insulative film formed on the semiconductor substrate; and an electrode connected to the second conductive film.

The first conductive film includes a first polysilicon film formed on the side surface and bottom surface of the first trench and a second polysilicon film formed on the first polysilicon film, and the second conductive film includes a third polysilicon film formed on the side surface of the second trench and a fourth polysilicon film formed on the third polysilicon film.

Further, if the opening width of the first trench is Wa', the opening width of the second trench is Wb' and the maximum film thickness of the first to fourth polysilicon films on the side wall portion of the first and second trenches is t, then the condition that (Wa'−2t)<(Wb'−2t) and Wa'>2t is satisfied.

A method for manufacturing the semiconductor device of this invention comprises the steps of forming a first trench having an opening width of Wa' and a second trench having an opening width of Wb' in a semiconductor substrate; forming a first insulative film on the entire portion of the internal surfaces of the first and second trenches; forming first conductive films with a film thickness of t (Wa'−2t<Wb'−2t, Wa'>2t) on the internal surfaces of the first and second trenches; etching the first conductive film to leave part of the first conductive film lying on the bottom surface of the first trench and remove part of the first conductive film lying on the bottom surface of the second trench; removing part of the first insulative film lying on the bottom surface of the second trench; filling second conductive films in the first and second trenches; forming a second insulative film on the semiconductor substrate; and forming an electrode to be connected to the second conductive film in the second trench.

The first trench is formed in a ring form to surround the element region and the second trench is formed in a well form.

According to the structure of the above semiconductor device, in the element isolating first trench, the semiconductor substrate and the first conductive film in the first trench are isolated from each other, and in the second trench for applying a potential to the substrate, the semiconductor substrate and the second conductive film in the second trench are connected to each other.

Therefore, for example, when a bipolar transistor is formed in the element region, a capacitor which may be constructed by the first conductive film in the first trench, the first insulative film on the side surface of the first trench and the semiconductor substrate (collector) is not formed.

That is, a parasitic capacitance between the collector of the bipolar transistor and the semiconductor substrate does not increase and the operation speed is not lowered.

Further, according to the above manufacturing method, by controlling the opening width Wa' and Wb' of the first and second trenches and the film thickness t of the first conductive film, the etching rate ratio of the first conductive films on the bottom surfaces of the first and second trenches is changed.

Therefore, it becomes possible to leave part of the first conductive film on the bottom portion of the first trench and remove part of the first conductive film on the bottom portion of the second trench by controlling time for etching the first conductive film, for example.

That is, the semiconductor device can be formed without increasing the number of manufacturing steps.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompany drawings, which are incorporated in and constitute a part of the specification, illustrate a presently preferred embodiment of the invention and, together with the general description given above and the detailed description of the preferred embodiment given below, serve to explain the principles of the invention.

FIG. 10 is a view showing one step of the process for manufacturing the semiconductor device of this invention;

FIG. 11 is a view showing one step of the process for manufacturing the semiconductor device of this invention;

FIG. 12 is a view showing one step of the process for manufacturing the semiconductor device of this invention;

FIG. 13 is a plan view showing the relation between the opening ratio of the trench and the area ratio thereof;

FIG. 16 is a view showing one step of the process for manufacturing the semiconductor device of this invention.

DETAILED DESCRIPTION OF THE PREFERRED EMBODIMENTS

There will now be described a semiconductor device and a method for manufacturing the same according to one embodiment of this invention in detail with reference to the accompanying drawings.

Figure 1:
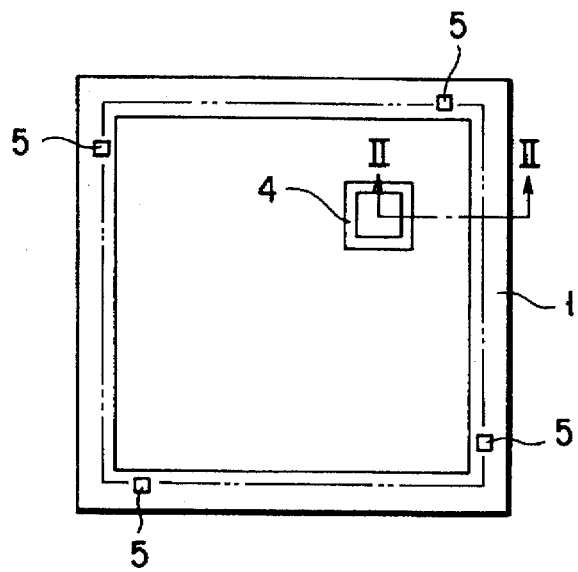
FIG. 1 is a plan view showing a conventional semiconductor device.
Figure 2:
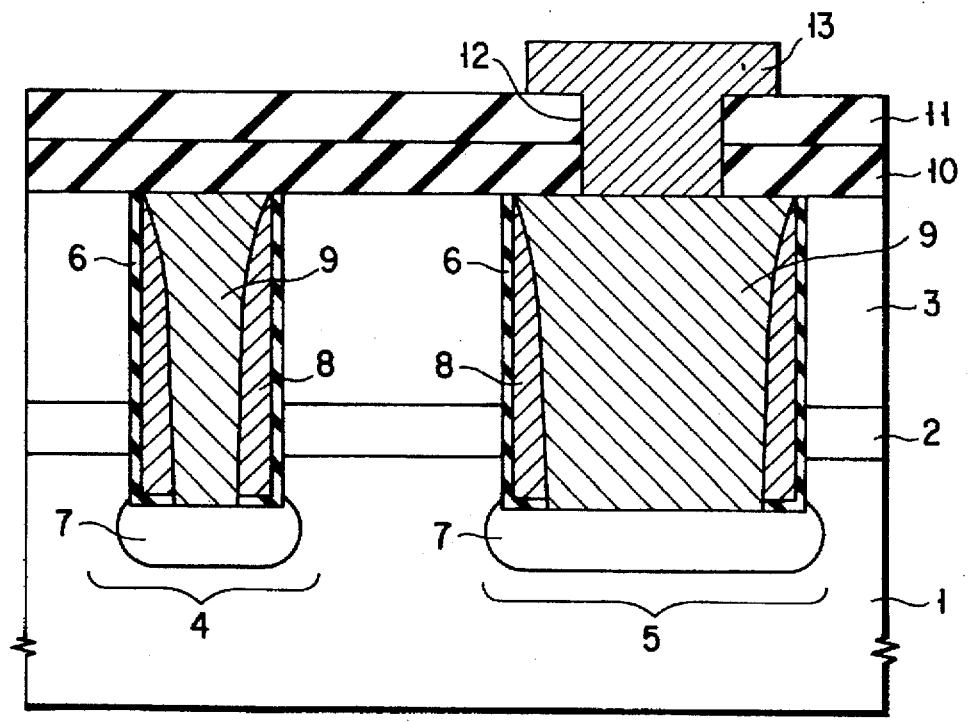
FIG. 2 is a cross sectional view taken along the line II—II of FIG. 1.
Figure 3:
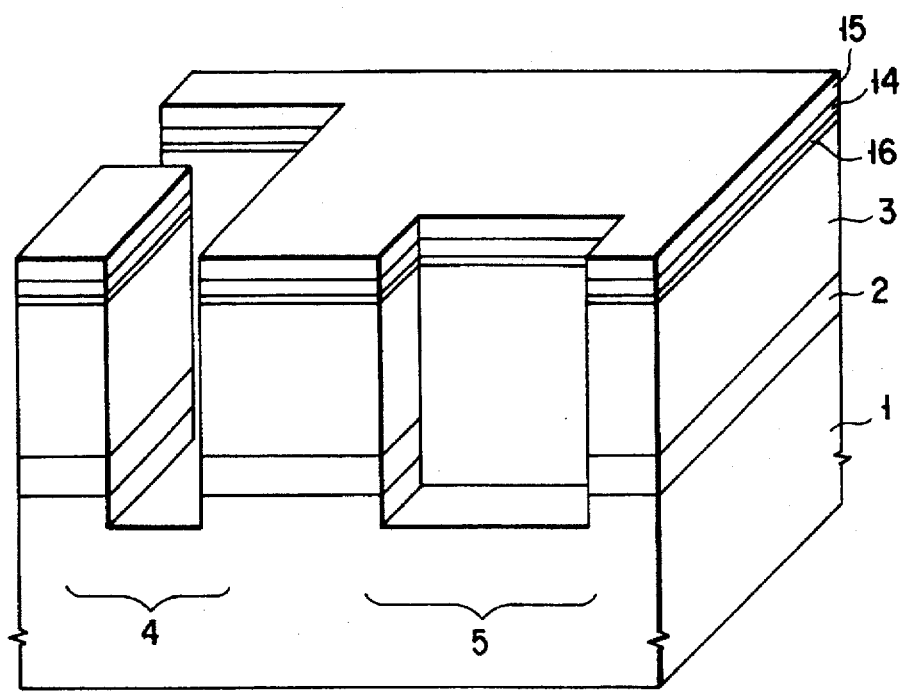
FIG. 3 is a view showing one step of the process for manufacturing the conventional semiconductor device.
Figure 4:
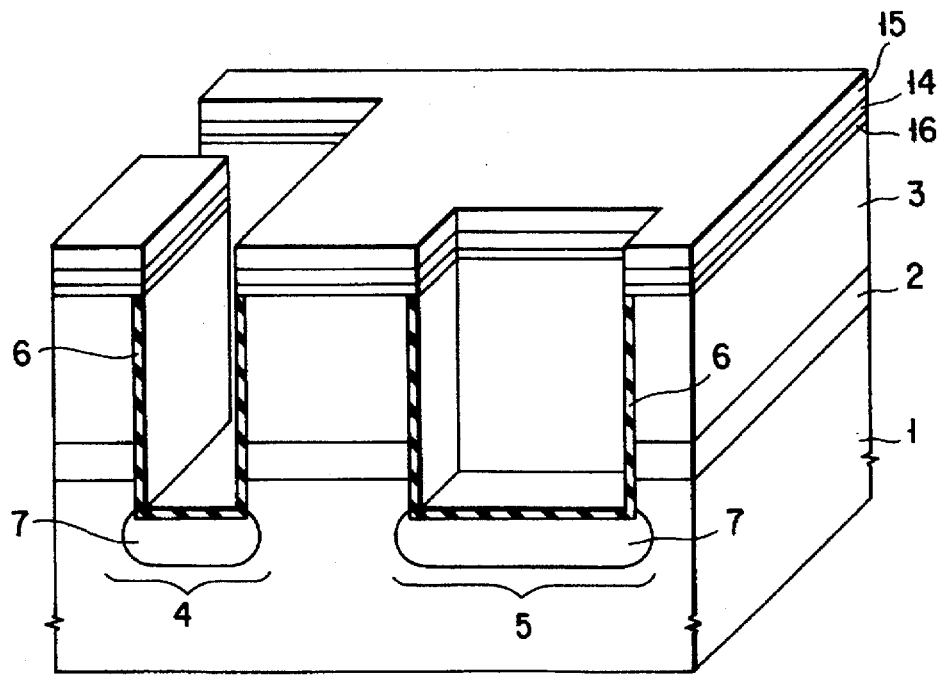
FIG. 4 is a view showing one step of the process for manufacturing the conventional semiconductor device.
Figure 5:
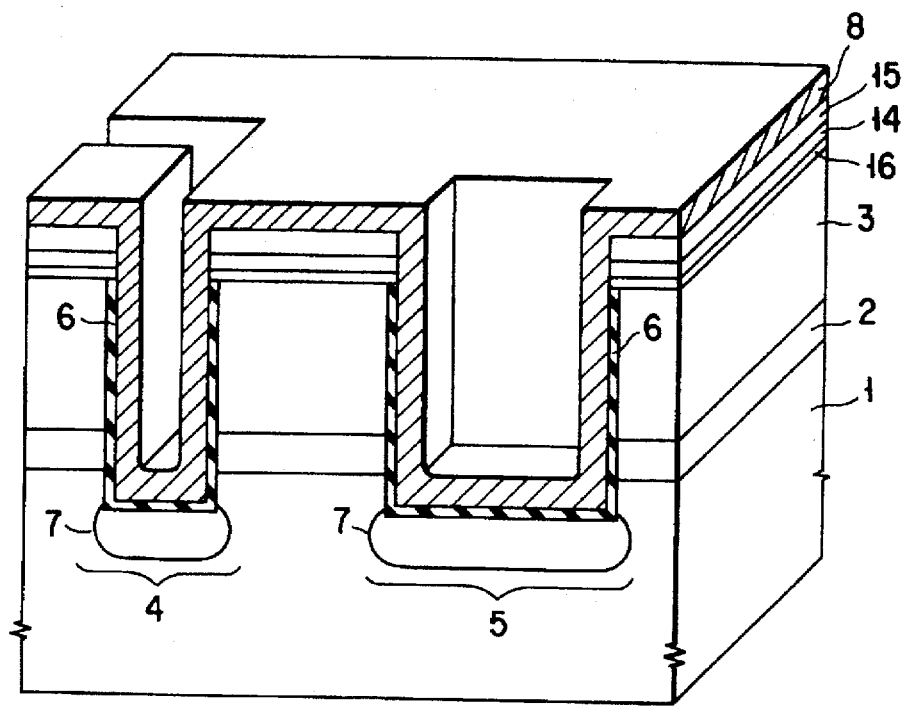
FIG. 5 is a view showing one step of the process for manufacturing the conventional semiconductor device.
Figure 6:
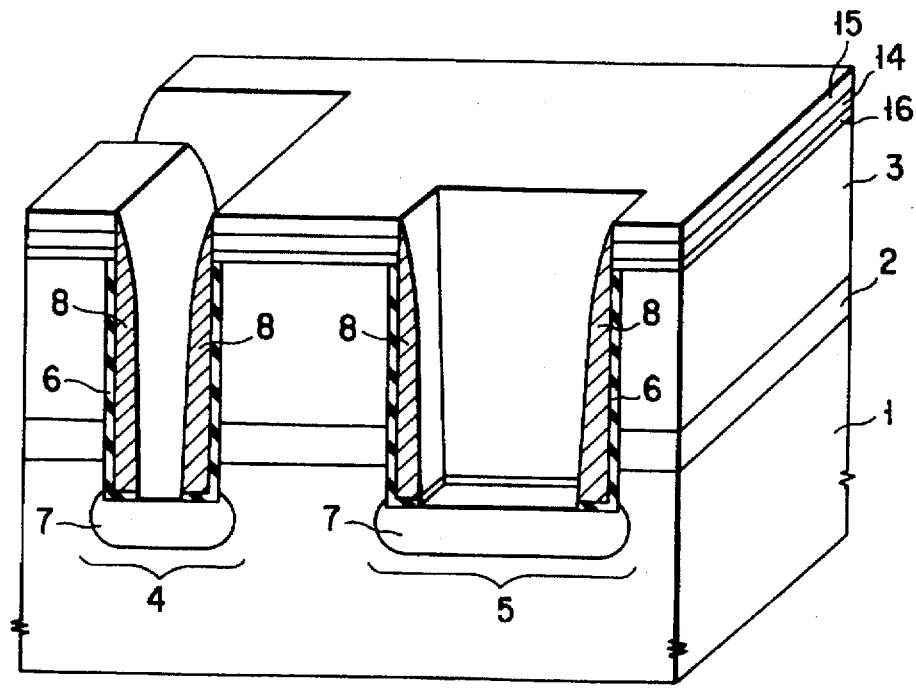
FIG. 6 is a view showing one step of the process for manufacturing the conventional semiconductor device.
Figure 7:
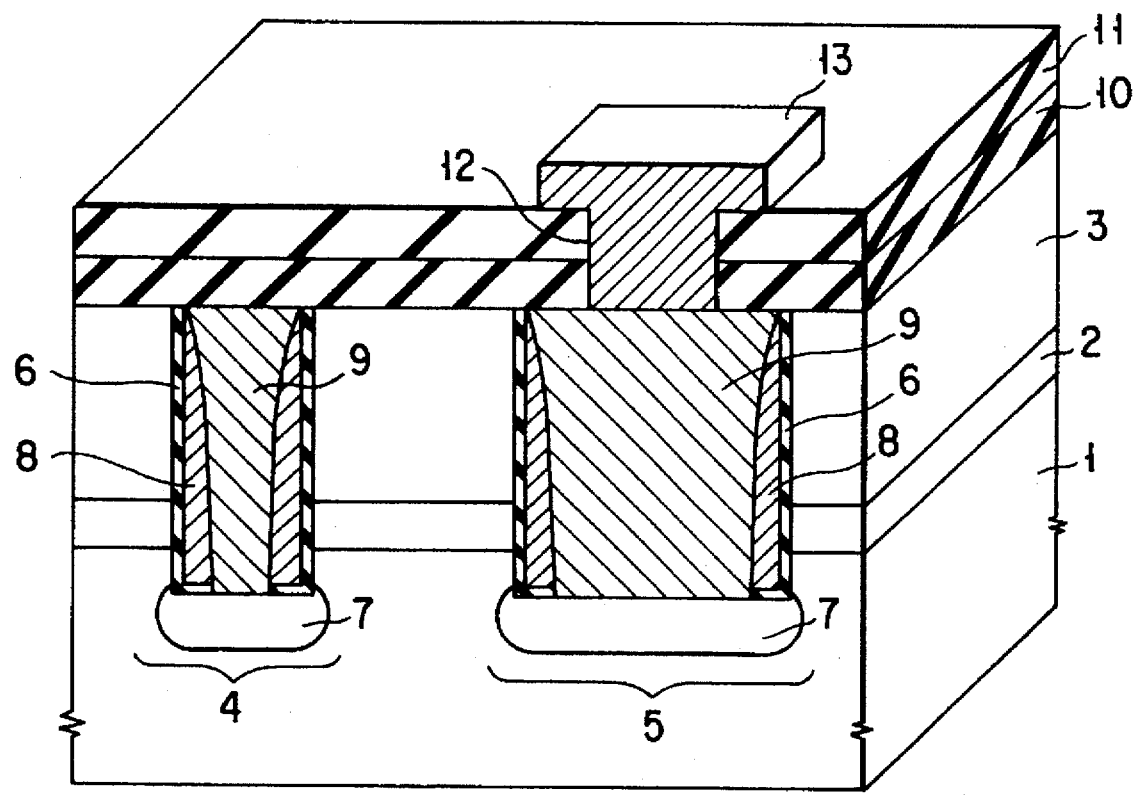
FIG. 7 is a view showing one step of the process for manufacturing the conventional semiconductor device.
Figure 8:
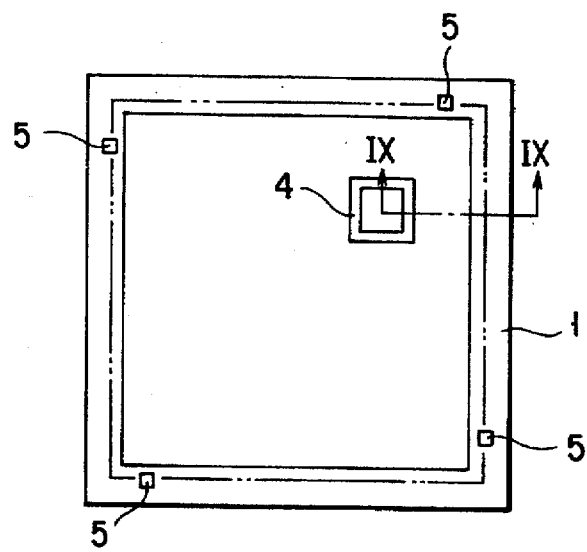
FIG. 8 is a plan view showing a semiconductor device of this invention.
Figure 9:
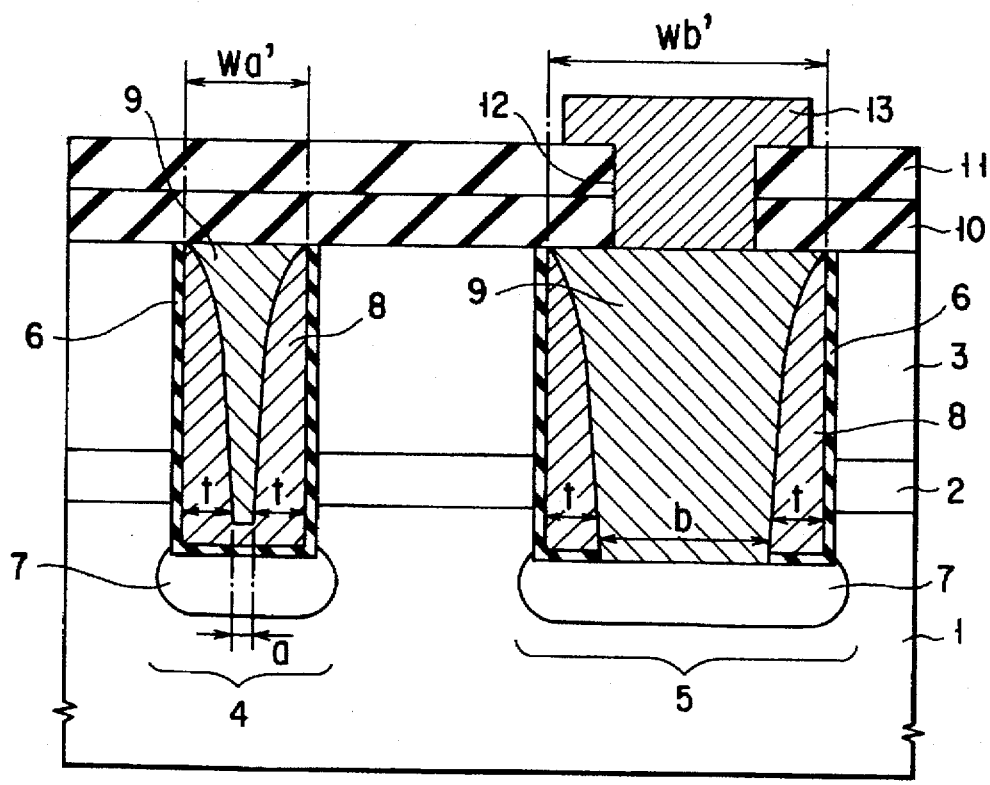
FIG. 9 is a cross sectional view taken along the line IX—IX of FIG. 8.

FIGS. 8 and 9 show a semiconductor device according to one embodiment of this invention. FIG. 8 is a plan view of the semiconductor device according to the embodiment of this invention and FIG. 9 is a cross sectional view taken along the line IX—IX of FIG. 8.

An N-type impurity layer 2 is formed on a P-type silicon substrate 1. An N-type epitaxial layer 3 is formed on the N-type impurity layer 2.

An element isolating trench 4 is formed to extend from the surface of the N-type epitaxial layer 3 to the substrate 1. Trenches 5 for applying a potential to the substrate 1 are formed to extend from the surface of the N-type epitaxial layer 3 to the substrate 1.

The trench 4 is formed in a ring form to surround an element region in the central portion of the substrate 1, and the trenches 5 are formed in a well form in the peripheral portion of the substrate 1. The opening width of the trench 4 is Wa' and the opening width (minimum opening width) of the trench 5 is Wb'. The opening width Wb' of the trench 5 is made larger than the opening width Wa' of the trench 4 (Wb'>Wa').

Silicon oxide films 6 are formed on the side surfaces and bottom surfaces of the trenches 4, 5. In this case, part of the silicon oxide film 6 which lies on part of the bottom surface of the trench 5 is removed. P-type impurity layers 7 of high impurity concentration are formed in the substrate 1 in the bottom portions of the trenches 4, 5.

Polysilicon films 8 are formed on the side surfaces of the trenches 4, 5 and on the bottom surface of the trench 4. Further, the maximum film thickness of the polysilicon film 8 on the side wall portion of the trench is set to t. The maximum film thickness t of the polysilicon film 8 is set smaller than half the opening width Wa' of the trench 4 (t<Wa'/2).

Further, trenches 4, 5 are filled with polysilicon films 9.

A laminated structure of a field oxide film 10 and inter-level insulation film 11 is formed on the N-type epitaxial layer 3 and trenches 4, 5. A contact hole 12 is formed in the laminated structure of field oxide film 10 and inter-level insulation film 11 which lies on the trench 5.

A metal wiring 13 is formed in and on the contact hole 12 to reach the polysilicon film 9. Therefore, when a potential is applied to the metal wiring 13, the potential is applied to the substrate 1 via the polysilicon film 9 in the trench 5 and P-type impurity layer 7.

With the structure of the above semiconductor device, the silicon oxide film 6 is also formed on the bottom surface of the element isolating trench 4. Therefore, the substrate 1 and the polysilicon films 8, 9 in the trench 4 are electrically isolated from each other.

That is, in a case where a bipolar transistor is formed in the element region, since the polysilicon films 8, 9 in the trench 4 are set in the electrically floating state, the parasitic capacitance between the collector of the bipolar transistor and the substrate 1 will not increase, thereby lowering the operation speed.

On the other hand, the silicon oxide film 6 on the bottom surface of the trench 5 for applying a potential to the substrate 1 is removed. Therefore, the substrate 1 and the polysilicon films 8, 9 in the trench 5 are electrically connected to each other.

That is, a preset potential can be applied to the substrate 1.

Next, a method for manufacturing the semiconductor device of FIGS. 8 and 9 is explained.

First, as shown in FIG. 10, for example, an N-type impurity layer 2 with a film thickness of 1.5 μm and an impurity concentration of $2.5 \times 10^{19}$ atoms/cm$^3$ is formed on a P-type silicon substrate 1 having a plane orientation (111) and a resistivity of 10 ohm, for example.

Further, for example, an N-type epitaxial layer 3 with a film thickness of 1 μm and an impurity concentration of $1 \times 10^{16}$ atoms/cm$^3$ is formed on the N-type impurity layer 2 by the epitaxial growth.

A silicon oxide film 16 with a film thickness of 30 nm is formed on the N-type epitaxial layer 3. Further, a silicon nitride film 14 and silicon oxide film 15 are formed on the silicon oxide film 16. Then, the silicon nitride film 14 and the silicon oxide films 15, 16 are patterned by the photo etching process.

After this, the N-type epitaxial layer 3 is etched by the anisotropic etching process with the silicon oxide film 15 used as a mask to form an element isolating trench 4 having an opening width Wa of approx. 1.2 μm and a depth of approx. 6.5 μm and a trench 5 having a minimum opening width Wb of approx. 5 μm and a depth of approx. 6.5 μm.

The trenches 4, 5 are formed to extend from the surface of the N-type epitaxial layer 3 to the substrate 1. The trench 4 is formed to surround the element region in the central portion of the substrate 1 and the trench 5 is formed in a well form in the peripheral portion of the substrate 1.

Next, as shown in FIG. 11, defective layers of the internal surfaces of the trenches 4, 5 are removed by use of the isotropic etching method, or chemical processing such as SH processing.

Then, silicon exposed to the internal surfaces of the trenches 4, 5 is oxidized by the thermal oxidation method to form silicon oxide films 6 with a film thickness of approx. 50 nm on the internal surfaces of the trenches 4, 5.

P-type impurity such as boron is injected into the substrate 1 in the bottom portions of the trenches 4, 5 by the ion-implantation technique in a condition of a dose amount of $1 \times 10^{14}$ atoms/cm$^2$, for example, with the silicon nitride film 14 and the silicon oxide films 15, 16 used as a mask so as to form P-type impurity layers 7 of high impurity concentration in the bottom portions of the trenches 4, 5.

Next, as shown in FIG. 12, a polysilicon film 8 with the film thickness t of approx. 250 nm is formed on the entire surface of the substrate 1 by the CVD method. As a result, the opening width of the trench 4 becomes a and the minimum opening width of the trench 5 becomes b.

Next, the opening width a of the trench 4 and the minimum opening width b of the trench 5 are studied.

The opening widths of the trenches 4, 5 at the time of formation of the trenches 4, 5 vary depending on the etching process (removal of the defective layers) for the internal surfaces of the trenches 4, 5 or the thermal oxidation process (formation of the silicon oxidation films 6) effected in the later step.

If the opening width of the trench 4 set immediately before formation of the polysilicon film 8 is Wa' and the minimum opening width of the trench 5 is Wb', then the opening width a of the trench 4 after formation of the polysilicon film 8 is set to (Wa'−2t) and the minimum opening width b of the trench 5 is set to (Wb'−2t).

For example, in the case of this embodiment, the opening width Wa' of the trench 4 set immediately before formation of the polysilicon film 8 becomes approx. 1.5 μm and the minimum opening width Wb' of the trench 5 becomes approx. 5.3 μm so that the opening width a of the trench 4 set after formation of the polysilicon film 8 will become 1 μm and the minimum opening width b of the trench 5 will become 4.8 μm.

As shown in FIG. 13, the ratio (b/a) of the minimum opening width b of the trench 5 to the opening width a of the trench 4 indicates the ratio (Sb/Sa) of the etching area Sb per unit length of the polysilicon film 8 in the bottom portion of the trench 5 to the etching area Sa per unit length of the polysilicon film 8 in the bottom surface of the trench 4.

Next, the relation between the opening widths of the trenches 4, 5 and the etching rate ratio of the polysilicon films 8 in the bottom portions of the trenches 4, 5 is studied.

The etching rates of the polysilicon films 8 in the bottom portions of the trenches 4, 5 depend on the etching areas per unit length of the polysilicon films 8 in the bottom portions of the trenches 4, 5. That is, as the etching areas per unit length of the polysilicon films 8 in the bottom portions of the trenches 4, 5 are enlarged, the etching rates of the polysilicon films 8 in the bottom portions of the trenches 4, 5 become higher.

Figure 14:
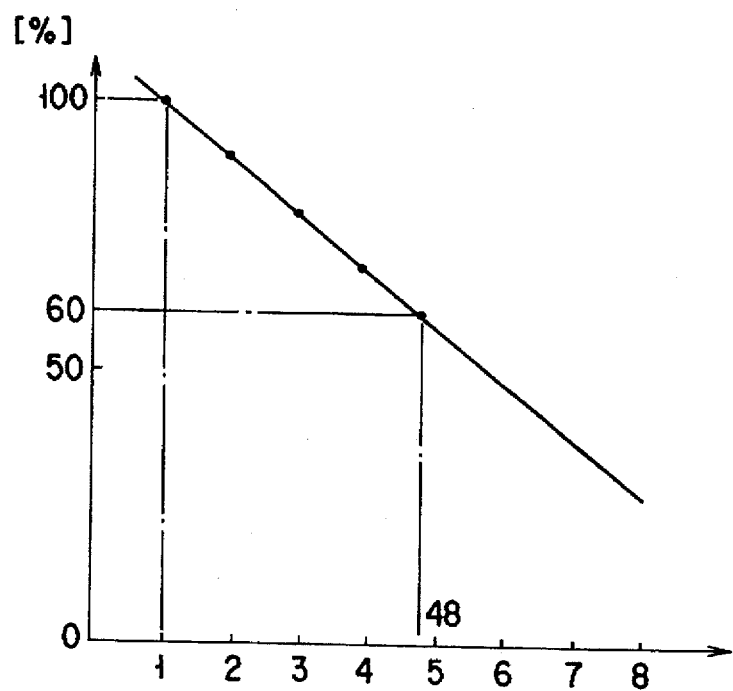
FIG. 14 is a diagram showing the relation between the opening ratio of the trench and the etching rate ratio of the polysilicon films on the bottom portions of the trenches.

Therefore, as shown in FIG. 14, if the etching rate of the polysilicon film 8 in the bottom portion of the trench 4 is Ra (mm/min) and the etching rate of the polysilicon film 8 in the bottom portion of the trench 5 is Rb (mm/min), then the etching rate ratio {(Ra/Rb)×100} varies in proportion to the ratio (b/a) of the minimum opening width b of the trench 5 to the opening width a of the trench 4.

That is, if the minimum opening width b of the trench 5 is larger than the opening width a of the trench 4, the etching rate Rb of the polysilicon film 8 in the bottom portion of the trench 5 becomes larger than the etching rate Ra of the polysilicon film 8 in the bottom portion of the trench 4.

For example, in the case of this embodiment, since the opening width a of the trench 4 after formation of the polysilicon film 8 is 1 μm and the minimum opening width b of the trench 5 is 4.8 μm, the etching rate ratio becomes approx. 60% as shown in FIG. 14.

Figure 15:
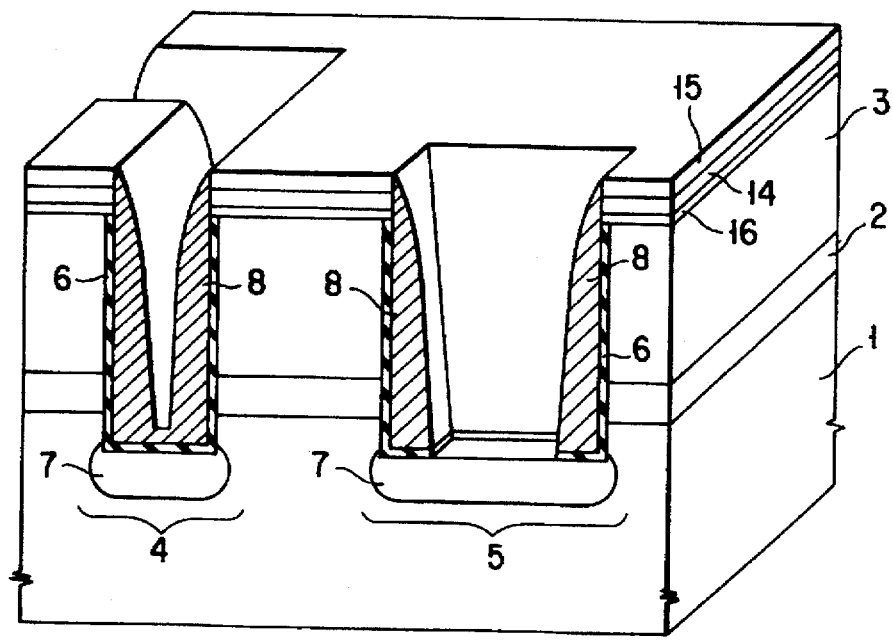
FIG. 15 is a view showing one step of the process for manufacturing the semiconductor device of this invention.

Therefore, in this example, as shown in FIG. 15, the polysilicon film 8 is etched by use of the anisotropic etching technique to remove the polysilicon film 8 in the bottom portion of the trench 5 and leave the polysilicon film 8 of approx. 150 nm in the bottom portion of the trench 4.

Further, $NH_4F$ or the like is used to remove the silicon oxide film 6 on the bottom portion of the trench 5 so as to expose the P-type impurity layers 7 in the bottom portion of the trench 5.

Next, as shown in FIG. 16, a polysilicon film 9 is formed to a thickness of approx. 2 μm on the entire surface of the substrate 1 to completely fill the trenches 4, 5 by the CVD method or the like. Then, P-type impurity such as boron is injected into the polysilicon 9 by the ion-implantation technique in a condition of a dose amount of $1 \times 10^{16}$ atoms/cm$^2$, for example, so as to lower the resistance of the polysilicon film 9.

Further, the polishing process or the like is effected to leave the polysilicon film 9 only in the trenches 4, 5 and the silicon oxide film 15 (refer to FIG. 15) is removed by using $NH_4F$ or the like.

After this, the silicon nitride film 14 and silicon oxide film 16 (refer to FIG. 15) are patterned to leave the silicon nitride film 14 and silicon oxide film 16 only on the element region.

Then, a field oxide film 10 is formed by the LOCOS method and the element isolating process is completed.

Next, the silicon nitride film 14 and silicon oxide film 16 on the element region are removed and MOS transistors or bipolar transistors are formed in the element region. After this, an inter-level insulative film 11 is formed on the entire surface of the substrate 1. Then, a contact hole 12 is formed in the field oxide film 10 and inter-level insulative film 11 on the trench 5.

Formation of an electrode for applying a potential to the substrate 1 is completed by forming a metal wiring 13 in and on the contact hole 12.

According to the above manufacturing method, the etching rate ratio of the polysilicon films 8 in the bottom portions of the trenches 4, 5 is changed by controlling the opening widths Wa', Wb' of the trenches 4, 5 and the film thickness t of the polysilicon film 8.

Therefore, the polysilicon film 8 can be left in the bottom portion of the trench 4 and the polysilicon film 8 in the bottom portion of the trench 5 can be removed by controlling time for etching the polysilicon film 8 or the like.

That is, a semiconductor device in which the substrate 1 and the polysilicon films 8, 9 in the trench 4 are isolated from each other in the element isolating trench 4 and the substrate 1 and the polysilicon films 8, 9 in the trench 5 are connected to each other in the trench 5 for applying a potential to the substrate 1 can be manufactured without increasing the number of manufacturing steps.

As described above, according to the semiconductor device of this invention and the manufacturing method thereof, the following effect can be attained.

In the element isolating trench, the substrate and the polysilicon film in the trench are isolated from each other, and in the trench for applying a potential to the substrate, the substrate and the polysilicon film in the trench are connected to each other.

Therefore, for example, when a bipolar transistor is formed in the element region, a capacitor which may be constructed by the polysilicon film in the trench, the silicon oxide film on the side surface of the trench and epitaxial layer (collector) is not formed.

That is, when the size of the element region surrounded by the trench is 10×7 μm, the parasitic capacitance between the collector of the bipolar transistor and the substrate becomes approx. 22 (fF) in the conventional semiconductor device, but it becomes approx. 10 (fF) in the semiconductor device of this invention. As a result, when this invention is applied to a D-type flip-flop circuit of ECL, the operation speed can be enhanced by approx. 6%.

Further, the semiconductor device of this invention can be easily manufactured without increasing the number of manufacturing steps by controlling the opening widths of the trenches and the film thickness of the polysilicon film and changing the etching rate ratio of the polysilicon films in the bottom portions of the trenches.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor layer;
   a first trench formed in said semiconductor layer, for isolating semiconductor elements;

a second trench formed in said semiconductor layer, for applying a potential to said semiconductor layer;

a first insulative film formed to cover the entire portion of the internal surface of said first trench;

a second insulative film formed to cover the internal surface of said second trench except part of the bottom surface thereof;

a first conductive film filled in said first trench, said first conductive film including a first polysilicon film formed on a side surface and a bottom surface of said first trench and a second polysilicon film formed on said first polysilicon film, where when an opening width of said first trench is Wa', an opening width of said second trench is Wb', and a maximum film thickness of one of said first polysilicon film lying on the side surface of said first trench and said second polysilicon film lying on the side surface of said second trench is t, then the condition that $(Wa'-2t)<(Wb'-2t)$ and $Wa'>2t$ is satisfied;

a second conductive film filled in said second trench and connected to said semiconductor layer, wherein said second conductive film includes a third polysilicon film formed on a side surface of said second trench and a fourth polysilicon film formed on said third polysilicon film;

a third insulative film formed on said semiconductor layer and on said first and second conductive films and having a contact hole formed therein over said second trench; and an electrode formed on said third insulative film and connected to said second conductive film formed via said contact hole.

2. A semiconductor device according to claim 1, wherein said first trench is formed in a ring form to surround an element region and is disposed in the central portion of said semiconductor layer.

3. A semiconductor device according to claim 1, wherein said second trench is formed in a well form and disposed in the peripheral portion of said semiconductor layer.

4. A semiconductor device according to claim 1, wherein impurity layers are formed in a portion of said semiconductor layer which lies adjacent to a bottom portion of said first trench and in a another portion of said semiconductor layer which lies adjacent to a bottom portion of said second trench.

5. A semiconductor device according to claim 1, wherein said semiconductor layer includes a semiconductor substrate of a first conductivity type, and an epitaxial layer of a second conductivity type formed on said semiconductor substrate; and the bottom portions of said first and second trenches reach said semiconductor substrate.

6. A semiconductor device according to claim 1, wherein said semiconductor layer includes a semiconductor substrate of a first conductivity type, an impurity layer of a second conductivity type formed on said semiconductor substrate, and an epitaxial layer of said second conductivity type formed on said impurity layer; and the bottom portions of said first and second trenches reach said semiconductor substrate.

* * * * *